United States Patent
Goishi

(10) Patent No.: US 7,236,903 B2
(45) Date of Patent: Jun. 26, 2007

(54) TEST APPARATUS AND CONTROL METHOD

(75) Inventor: Masaru Goishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 151 days.

(21) Appl. No.: 11/136,335

(22) Filed: May 24, 2005

(65) Prior Publication Data

US 2005/0270038 A1  Dec. 8, 2005

(51) Int. Cl.
*G06F 15/00* (2006.01)
(52) U.S. Cl. ......................................... 702/108; 714/25
(58) Field of Classification Search ................ 702/108, 702/182–185, 117–118, 188; 700/12, 26; 714/724, 725, 25, 26
See application file for complete search history.

(56) References Cited

U.S. PATENT DOCUMENTS 6,453,435 B1 * 9/2002 Limon et al. ................ 714/724

2001/0034866 A1 * 10/2001 Barry et al. ................. 714/734

* cited by examiner

*Primary Examiner*—Edward Raymond
(74) *Attorney, Agent, or Firm*—Osha Liang LLP

(57) ABSTRACT

A testing device that tests an electronic device includes: a pattern generator operable to generate a test pattern to be supplied to the electronic device and an expectation signal sequence to be output from the electronic device when the test pattern is supplied to the electronic device; a comparison unit operable to compare an output signal sequence output from the electronic device according to the test pattern with the expectation signal sequence; an acquisition controlling unit operable to cause the comparison unit to start comparing the output signal sequence and the expectation signal sequence when detecting an output header, which indicates the start of a comparison between the output signal sequence and the expectation signal sequence using the comparison unit, from the output signal sequence; and a comparison result outputting unit operable to acquire a comparison result from the comparison unit according to an instruction from the acquisition controlling unit.

9 Claims, 4 Drawing Sheets

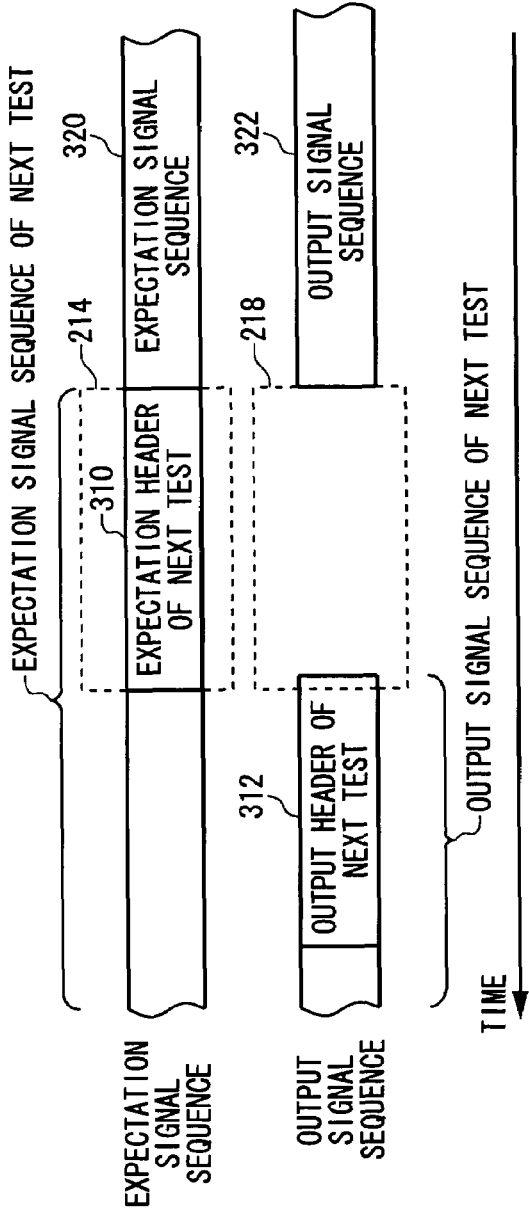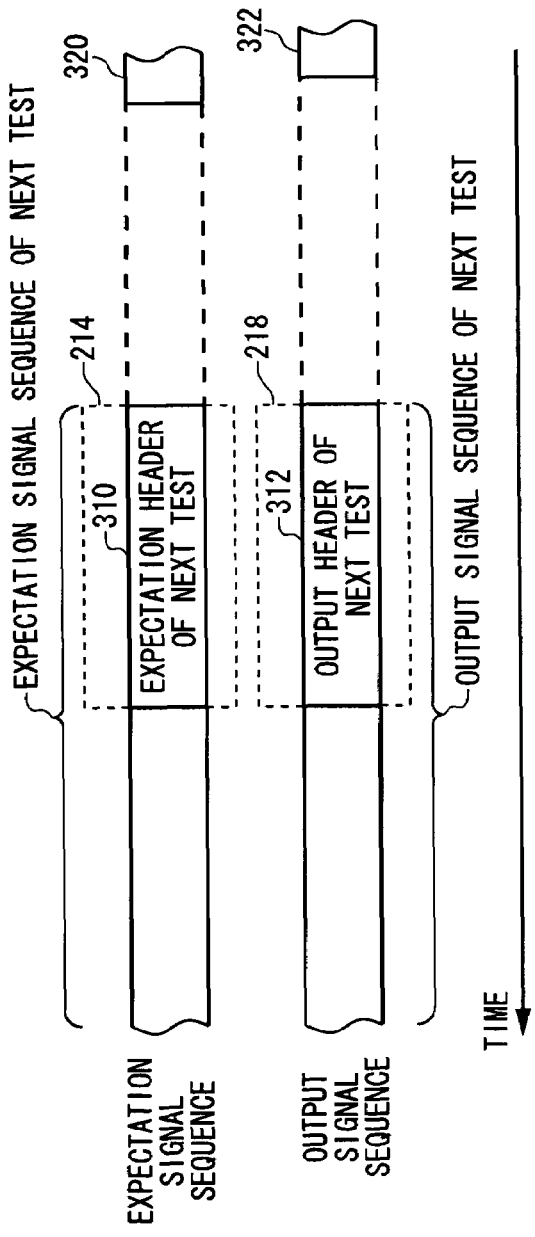

TEST APPARATUS AND CONTROL METHOD

BACKGROUND OF THE INVENTION

1. Field of the Invention

The present invention relates to a testing device and a control method testing an electronic device. The present application also relates to the following application, the contents of which are incorporated herein by reference if applicable.

A Japanese Patent Application No. 2004-64407 Filed on Mar. 8, 2004.

2. Description of Related Art

There is used a testing device that inputs a test pattern to an electronic device and tests the electronic device by comparing an output signal sequence output from the electronic device in response to the test pattern and an expectation signal sequence expected to be output from the electronic device.

However, the testing device cannot adequately test the electronic device when a gap in the timing between the output of the output signal sequence and the output of the expectation signal sequence is not uniform.

Therefore, it is an object of the present invention to provide a testing device and a control method that can solve the foregoing problems. The above and other objects can be achieved by combinations described in the independent claims. The dependent claims define further advantageous and exemplary combinations of the present invention.

SUMMARY OF THE INVENTION

To solve this problem, according to the first aspect of the present invention, there is provided a testing device that tests an electronic device. The testing device includes: a pattern generator operable to generate a test pattern to be supplied to the electronic device and an expectation signal sequence to be output from the electronic device when the test pattern is supplied to the electronic device; a comparison unit operable to compare an output signal sequence output from the electronic device according to the test pattern with the expectation signal sequence; an acquisition controlling unit operable to cause the comparison unit to start comparing the output signal sequence and the expectation signal sequence when detecting an output header, which indicates the start of a comparison between the output signal sequence and the expectation signal sequence using the comparison unit, from the output signal sequence; and a comparison result outputting unit operable to acquire a comparison result from the comparison unit according to an instruction from the acquisition controlling unit.

Moreover, the comparison unit may include: a first converter that converts the serial expectation signal sequence into a parallel signal sequence every a predetermined data size; a second converter that converts the serial output signal sequence into a parallel signal sequence every the predetermined data size; and an output header detector that detects the output header based on the comparison between the converted output signal sequence and the converted expectation signal sequence, and the acquisition controlling unit may detect the output header based on the comparison result from the output header detector.

Moreover, the acquisition controlling unit may stop the comparison performed in the comparison unit when the test by the test pattern is finished, and the comparison unit may acquire an expectation header showing an expected value of an output header corresponding to a next test following the test by the test pattern as the expectation signal sequence.

Moreover, the comparison result outputting unit may output a signal showing that the test by the test pattern is correct in a state where the comparison by the comparison unit has been stopped.

Moreover, the comparison unit may include: a first shift register that acquires the expectation signal sequence; a second shift register that acquires the output signal sequence; an output header detector that compares the output signal sequence acquired by the second shift register and the expectation signal sequence acquired by the first shift register using a predetermined plurality of stages of the shift registers when detecting the output header; and a comparator that compares the output signal sequence acquired by the second shift register and the expectation signal sequence acquired by the first shift register using one predetermined stage of each of the shift registers when having detected the output header.

Moreover, the acquisition controlling unit may stop acquiring the expectation signal sequence when detecting an expectation header to indicate the start of the expectation signal sequence from the first shift register, and resume acquiring the expectation signal sequence when detecting the output header from the second shift register.

Moreover, the acquisition controlling unit may decide correspondence between the output signal sequence and the expectation signal sequence acquired by the second shift register and the first shift register in order to detect the output header.

Moreover, the acquisition controlling unit may use all stages of the shift registers during detecting the output header and use some stages of the shift registers during comparing the output signal sequence and the expectation signal sequence.

According to the second aspect of the present invention, there is provided a control method controlling a testing device that tests an electronic device. The control method includes: generating a test pattern to be supplied to the electronic device and an expectation signal sequence to be output from the electronic device when the test pattern is supplied to the electronic device; and starting comparing an output signal sequence and the expectation signal sequence when detecting an output header, which indicates the start of a comparison between the output signal sequence and the expectation signal sequence using a comparison unit, from the output signal sequence.

The summary of the invention does not necessarily describe all necessary features of the present invention. The present invention may also be a sub-combination of the features described above.

The summary of the invention does not necessarily describe all necessary features of the present invention. The present invention may also be a sub-combination of the features described above.

BRIEF DESCRIPTION OF THE DRAWINGS

FIGS. 4A and 4B are views exemplary showing signal sequences acquired by a first shift register and a second shift register.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
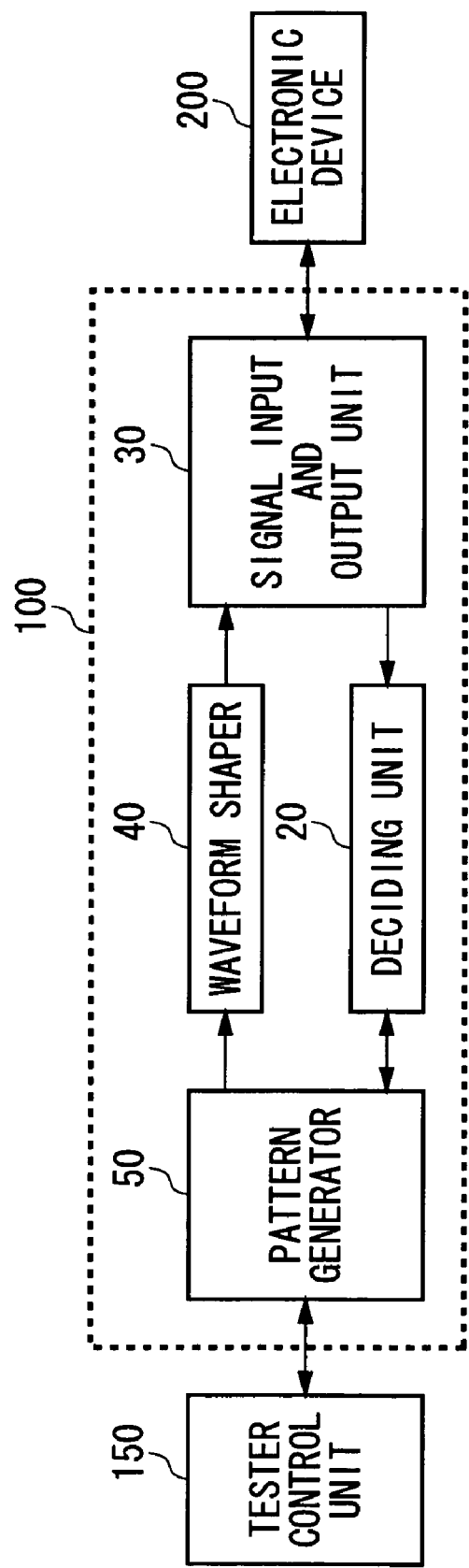
FIG. 1 is a view exemplary showing a configuration of a testing device according to an embodiment of the present invention.

FIG. 1 is a view exemplary showing a configuration of a testing device 100 according to the present invention. The testing device 100 tests the electronic device 200. The testing device 100 includes a pattern generator 50, a waveform shaper 40, a signal input and output unit 30, and a deciding unit 20.

The pattern generator 50 generates a test pattern for testing the electronic device 200. The pattern generator 50 receives test data that are used for testing the electronic device 200 from a tester control unit 150 provided outside, and generates the test pattern based on the test data. Moreover, the tester control unit 150 is a computer such as a workstation. Moreover, the pattern generator 50 generates an expectation signal sequence showing an expected value to be output from the electronic device when the test pattern is supplied to the electronic device 200.

The waveform shaper 40 receives and shapes the test pattern, and supplies the shaped test pattern to the signal input and output unit 30 at the desired timing.

The signal input and output unit 30 supplies the received test pattern to the electronic device 200, and receives an output signal sequence output from the electronic device 200 based on the test pattern. Moreover, the signal input and output unit 30 supplies the received output signal sequence to the deciding unit 20.

The deciding unit 20 decides the quality of the electronic device 200 based on the received output signal sequence. For example, the deciding unit 20 receives the expectation signal sequence from the pattern generator 50, and decides the quality of the electronic device 200 by comparing the expectation signal sequence and the output signal sequence of the electronic device 200. For example, when the electronic device 200 to be tested receives a plurality of commands and sequentially processes these commands, output timing is different from one another according to an internal operational state of the device, in some cases. In this case, it is necessary to correctly decide when the output signal sequence output from the electronic device 200 should begin to be compared with the expectation signal sequence. Thus, in the present embodiment, the deciding unit 20 starts comparing the output signal sequence and the expectation signal sequence following an output head when detecting the output head that is an output signal output from the electronic device corresponding to the start portion of the test pattern.

Figure 2:
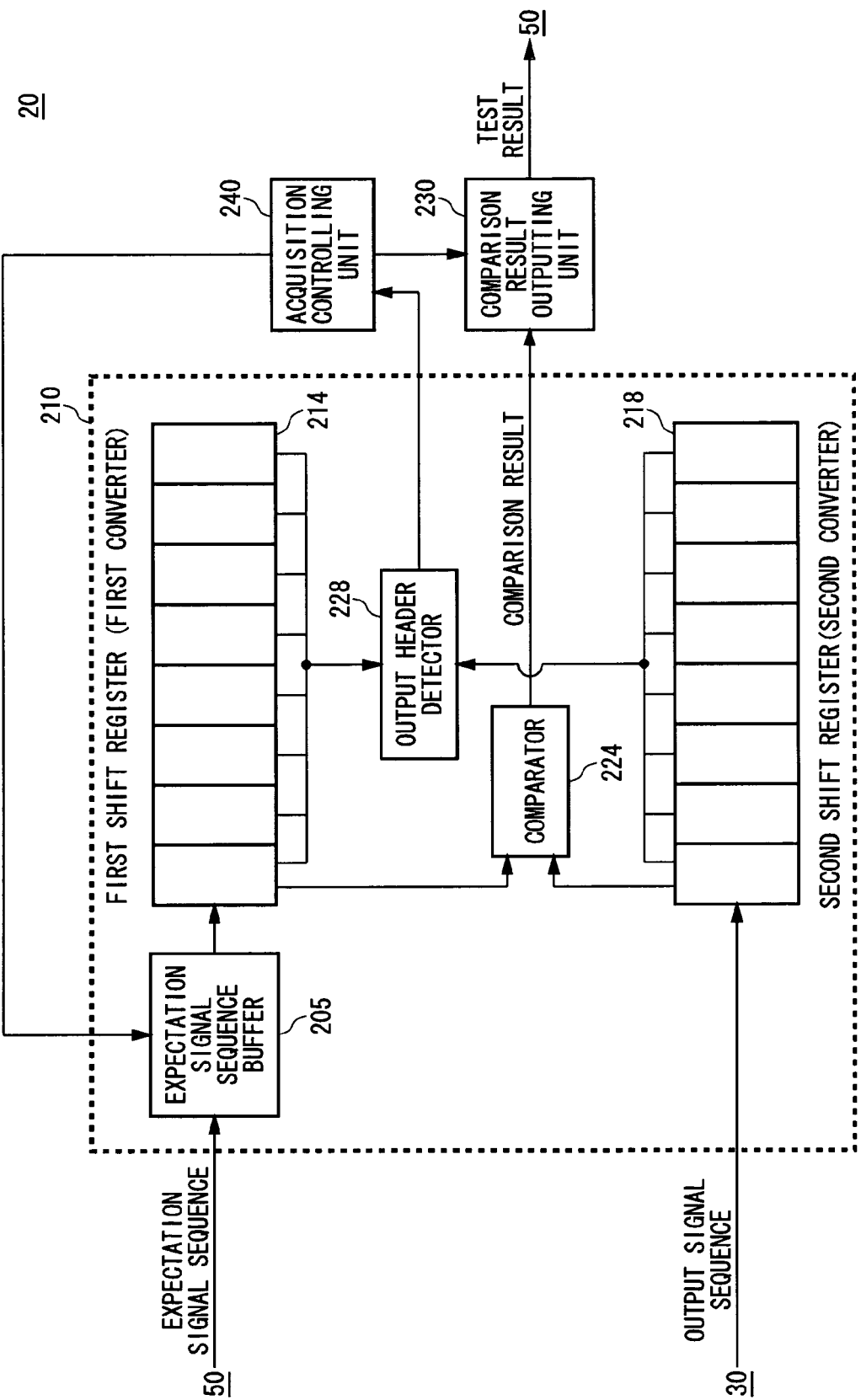
FIG. 2 is a view exemplary showing a configuration of a deciding unit.

FIG. 2 is a view exemplary showing a configuration of the deciding unit 20. The deciding unit 20 has a comparison unit 210, a comparison result outputting unit 230, and an acquisition controlling unit 240.

The comparison unit 210 acquires the expectation signal sequence from the pattern generator 50 according to an instruction from the acquisition controlling unit 240, and acquires the output signal sequence from the deciding unit 20. Then, when the comparison unit 210 detects an output header showing the start of comparison between the expectation signal sequence and the output signal sequence, the comparison unit 210 sends that effect to the acquisition controlling unit 240. For example, the comparison unit 210 detects the output header by comparing the output signal sequence with an expectation header showing the start of the expectation signal sequence. The acquisition controlling unit 240 sends an instruction to continue to acquire the expectation signal sequence to the comparison unit 210, and sends an instruction to start the acquisition of a comparison result to the comparison result outputting unit 230. After that, the comparison unit 210 compares the expectation signal sequence received from an expectation signal sequence buffer 205 and the output signal sequence received from the signal input and output unit 30, and sends the comparison result to the comparison result outputting unit 230. The comparison result outputting unit 230 outputs the comparison result to the pattern generator 50. In addition, the comparison result outputting unit 230 outputs a signal showing that a test by the test pattern is correct to the pattern generator 50 even in a state where the comparison by the comparison unit 210 is stopped.

The comparison unit 210 includes the expectation signal sequence buffer 205, a first shift register 214, a second shift register 218, a comparator 224, and an output header detector 228. The first shift register 214 acquires the expectation signal sequence from the expectation signal sequence buffer 205, converts this serial sequence into a parallel sequence every a predetermined data size (for example, every eight stages that is all stages of the first shift register 214), and outputs the converted result to the output header detector 228. Moreover, the first shift register 214 outputs the value of some stages (for example, the most significant stage that is a predetermined one stage) of the first shift register 214 to the comparator 224. Similarly, the second shift register 218 acquires the output signal sequence from the signal input and output unit 30, converts this serial sequence into a parallel sequence every a predetermined data size (for example, every eight stages), and outputs the converted result to the output header detector 228. Moreover, the second shift register 218 outputs the value of the most significant stage that is one predetermined stage to the comparator 224.

The output header detector 228 compares the converted output signal sequence and the converted expectation signal sequence, detects the output header based on the comparison result, and sends the detected result to the acquisition controlling unit 240. After that, the acquisition controlling unit 240 sends an instruction to continue to output the expectation signal sequence to the expectation signal sequence buffer 205. The expectation signal sequence buffer 205 sends the expectation signal sequence acquired from the pattern generator 50 to the first shift register 214 according to the instruction from the acquisition controlling unit 240. Then, the comparator 224 compares the values of the most significant stages of the first shift register 214 and the second shift register 218, and sequentially sends the comparison results to the comparison result outputting unit 230.

In this way, the comparison unit 210 uses all stages of each shift register when detecting the output header, and uses some stages of each shift register when detecting truth of the output signal. In other words, the comparison unit 210 can select the number of stages to be used in each shift register corresponding to the detection of the output header or the decision of truth of the output signal.

Figure 3:
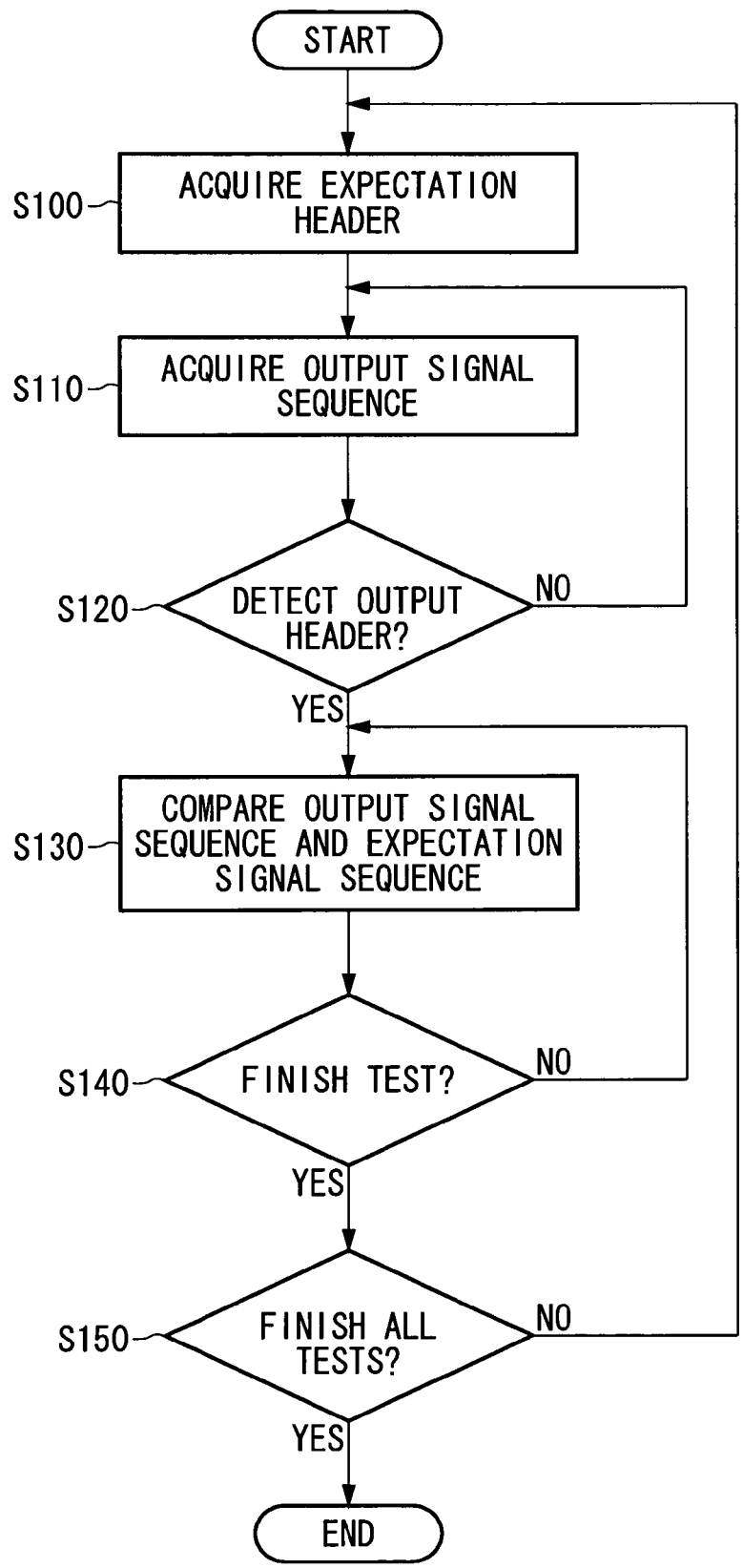
FIG. 3 is a flowchart showing an operation of the deciding unit.

FIG. 3 is a flowchart showing an operation of the deciding unit 20. At first, when the test of the electronic device 200 is not started, the first shift register 214 acquires the expectation header and stops acquiring the expectation signal sequence (S100). Then, the second shift-register 218 acquires the output signal sequence (S110). The output header detector 228 detects the output header (S120). For example, the output header detector 228 compares the output signal sequence and the expectation signal sequence acquired by the second shift register 218 and the first shift register 214 and decides correspondence between the sequences in order to detect the output header. Alternatively, the output header detector 228 may decide that the output header has been detected when the output signal sequence corresponds to a predetermined pattern. Moreover, when the output signal sequence and the expectation signal sequence are binary data rows, the output header detector 228 may decide that the binary data completely correspond to each other to detect the output header. On the other hand, when the expectation header is a binary data row and may have either of zero or one (for example, a don't care condition), the output header detector 228 may decide whether the output signal sequence corresponds to the expectation signal sequence with respect to the other data except for the don't care and detect the output header.

When it is not decided that the output header detector 228 has detected the output header (S120: NO), the deciding unit 20 returns the process to the step S110. When it is decided that the output header detector 228 has detected the output header (S120: YES), the first shift register 214 and the second shift register 218 respectively start acquiring the expectation signal sequence and the output signal sequence. Then, the comparator 224 compares the output signal sequence and the expectation signal sequence (S130). The deciding unit 20 decides whether the ongoing test by one test pattern has been finished (S140). When it is decided that the test has not been finished (S140: NO), the deciding unit 20 returns the process to the step S130. When it is decided that the test by the test pattern has been finished (S140: YES), it is decided whether the tests by all test patterns have been finished (S150). When it is not decided that all tests have been finished (S150: NO), the deciding unit 20 returns the process to the step S100. When it is decided that all tests have been finished (S150: YES), the deciding unit 20 finishes the process.

In this way, the deciding unit 20 can synchronize an expectation signal and an output signal and adequately continue the test when the test is started or the test by one test pattern is finished.

FIGS. 4A and 4B are views exemplary showing the signal sequences acquired by the first shift register 214 and the second shift register 218. The horizontal direction of this drawing indicates time. In FIG. 4A, the frames of broken lines showing the first shift register 214 and the second shift register 218 shows data respectively acquired by the first shift register 214 and the second shift register 218. In other words, in this drawing, the first shift register 214 and the second shift register 218 have already acquired an expectation signal sequence 320 and an output signal sequence 322 and finished the process such as a comparison.

Moreover, as shown in FIG. 4A, the first shift register 214 acquires an expectation header 310 of an expectation signal sequence to be used for a new test following the test using the test pattern. When the expectation header has been acquired, the acquisition controlling unit 240 stops outputting the expectation signal sequence by the expectation signal sequence buffer 205 to stop the comparison performed in the comparator 224. For example, the acquisition controlling unit 240 decides whether the expectation header 310 has been acquired by comparing predetermined data and data acquired in the first shift register 214. Moreover, the acquisition controlling unit 240 may decide whether the expectation header 310 has been acquired by receiving timing information, at which the expectation header 310 is acquired, from an outside apparatus such as the pattern generator 50.

Then, the output header detector 228 detects an output header showing the start of an output signal sequence from the second shift register 218. For example, as shown in FIG. 4B, when an output header 312 of the next test is acquired in the second shift register 218, the output header detector 228 can compare the second shift register 218 and the first shift register 214 to detect the output header. Then, when the output header 312 of the next test has been detected, the acquisition controlling unit 240 resumes outputting the expectation signal sequence from the expectation signal sequence buffer 205 to cause the first shift register 214 to resume acquiring the expectation signal sequence of the next test. In this way, when the expectation header has been detected from the first shift register 214, the acquisition controlling unit 240 can stop acquiring the expectation signal sequence until the output header is detected from the second shift register 218.

As apparent from the above-described embodiment, even when output timing is different by an internal operational state of the electronic device 200, the deciding unit 20 of the testing device 100 can control acquisition timing of the expectation signal sequence to synchronize the output signal sequence and the expectation signal sequence and adequately compare these sequences.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to synchronize an output signal from an electronic device and an expectation signal of the output signal and adequately compare these signals.

What is claimed is:

1. A testing device for testing an electronic device, comprising:
    a pattern generator operable to generate a test pattern supplied to the electronic device and an expectation signal sequence, which the electronic device is expected to output when the test pattern is supplied to the electronic device;
    a comparison unit operable to compare an output signal sequence output from the electronic device, which is supplied with the test pattern, with the expectation signal sequence;
    an acquisition controlling unit operable to cause said comparison unit to start comparing the output signal sequence and the expectation signal sequence when detecting an output header, which indicates the start of a comparison between the output signal sequence and the expectation signal sequence using said comparison unit, from the output signal sequence; and
    a comparison result outputting unit operable to acquire a comparison result from said comparison unit according to an instruction of said acquisition controlling unit,
    wherein a quality of the electronic device is decided based on the acquired comparison result, and a test result is output to the pattern generator.

2. The testing device as claimed in claim 1, wherein said comparison unit comprises:
- a first converter that converts the serial expectation signal sequence into a parallel signal sequence every a predetermined data size;
- a second converter that converts the serial output signal sequence into a parallel signal sequence every the predetermined data size; and
- an output header detector that detects the output header based on the comparison between the converted output signal sequence and the converted expectation signal sequence, and
- wherein said acquisition controlling unit detects the output header based on the comparison result from the output header detector.

3. The testing device as claimed in claim 1, wherein
- said acquisition controlling unit stops the comparison performed in said comparison unit when the test by the test pattern is finished, and
- said comparison unit acquires an expectation header showing an expected value of an output header corresponding to a next test following the test by the test pattern as the expectation signal sequence.

4. The testing device as claimed in claim 1, wherein said comparison result outputting unit outputs a signal showing that the test by the test pattern is correct in a state where the comparison by said comparison unit has been stopped.

5. The testing device as claimed in claim 1, wherein said comparison unit comprises:
- a first shift register that acquires the expectation signal sequence;
- a second shift register that acquires the output signal sequence;
- an output header detector that compares the output signal sequence acquired by the second shift register and the expectation signal sequence acquired by the first shift register using a predetermined plurality of stages of the shift registers when detecting the output header; and
- a comparator that compares the output signal sequence acquired by the second shift register and the expectation signal sequence acquired by the first shift register using one predetermined stage of each of the shift registers when having detected the output header.

6. The testing device as claimed in claim 5, wherein said acquisition controlling unit stops acquiring the expectation signal sequence when detecting an expectation header to indicate the start of the expectation signal sequence from the first shift register, and resumes acquiring the expectation signal sequence when detecting the output header from the second shift register.

7. The testing device as claimed in claim 5, wherein said acquisition controlling unit decides correspondence between the output signal sequence and the expectation signal sequence acquired by the second shift register and the first shift register in order to detect the output header.

8. The testing device as claimed in claim 5, wherein said acquisition controlling unit uses all stages of the shift registers during detecting the output header and uses some stages of the shift registers during comparing the output signal sequence and the expectation signal sequence.

9. A method for controlling a testing device that tests an electronic device, comprising:
- generating a test pattern supplied to the electronic device and an expectation signal sequence, which the electronic device is expected to output when the test pattern is supplied to the electronic device;
- starting comparing an output signal sequence output from the electronic device, which is supplied with the test pattern, and the expectation signal sequence when detecting an output header, which indicates the start of a comparison between the output signal sequence and the expectation signal sequence using a comparison unit, from the output signal sequence;
- deciding a quality of the electronic device based on the comparison result; and
- outputting a test result.

* * * * *